United States Patent [19]

Chapuy et al.

[11] Patent Number: 4,667,391

[45] Date of Patent: May 26, 1987

[54] PROCESS FOR THE PRODUCTION OF THIN FILM HALL EFFECT TRANSDUCERS

[75] Inventors: Claude Chapuy, Tullins; Gilles Delapierre, Seyssins, both of France

[73] Assignee: Commissariat a l'Energie Atomique, France

[21] Appl. No.: 746,534

[22] Filed: Jun. 19, 1985

[30] Foreign Application Priority Data

Jun. 29, 1984 [FR] France .................................. 84 10363

[51] Int. Cl.⁴ ...................... H01L 21/20; H01L 29/96; H01L 43/14
[52] U.S. Cl. ..................................... 29/576 T; 29/584; 29/590; 156/602; 156/617 R; 357/27
[58] Field of Search ...................... 29/590, 576 T, 584, 29/590; 357/27; 148/175; 156/602, 617 R, DIG. 105; 427/49, 87, 88, 91

[56] References Cited

U.S. PATENT DOCUMENTS

| | | | |
|---|---|---|---|
| 3,895,391 | 7/1975 | Konishi | 357/27 |
| 4,223,292 | 9/1980 | Morikawa et al. | 357/27 |
| 4,429,321 | 1/1984 | Matsumoto | 346/140 R |
| 4,498,951 | 2/1985 | Tamura et al. | 156/612 |
| 4,576,676 | 3/1986 | Smith et al. | 156/603 |

FOREIGN PATENT DOCUMENTS

| | | | |
|---|---|---|---|
| 51-90288 | 8/1976 | Japan | 357/27 |
| 55-123185 | 9/1980 | Japan . | |
| 59-08691 | 1/1984 | Japan | 156/617 R |
| 0128292 | 7/1984 | Japan | 156/617 R |
| 82/03639 | 10/1982 | PCT Int'l Appl. . | |

*Primary Examiner*—Olik Chaudhuri
*Attorney, Agent, or Firm*—Cesari and McKenna

[57] ABSTRACT

Process for the production of thin film Hall effect transducers of the type comprising semiconductor elements recrystallized in situ after deposition by a remelting of the semiconductor material, characterized by the following successive stages:

the active elements of a transducer are cut in the form of narrow strips, the assembly is covered with a SiO₂ insulating coating, this coating is covered with a conductive metal coating, the metal coating is etched so as to produce local heating resistors above the semiconductor strips, an electric current is passed into the heating resistors, the metal coating is removed from the heating resistors, followed by removal of the SiO₂ coating in the non-recrystallized zones of the semiconductor.

3 Claims, 11 Drawing Figures

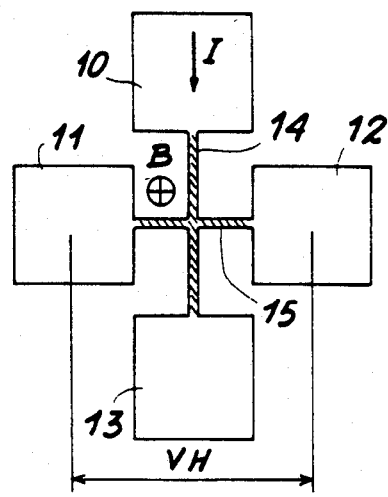
FIG. 5
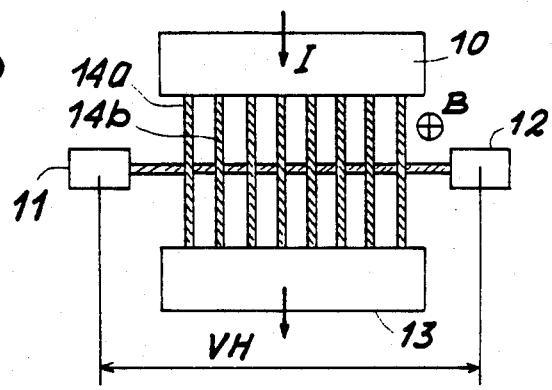
FIG. 6
FIG. 7
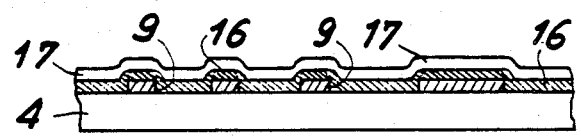
FIG. 8
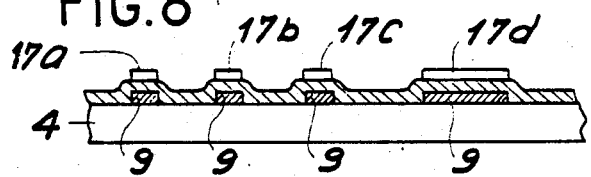

PROCESS FOR THE PRODUCTION OF THIN FILM HALL EFFECT TRANSDUCERS

BACKGROUND OF THE INVENTION

The Hall effect is a known physical principle and is widely used for measuring magnetic fields, the essence thereof being made clear by referring to FIG. 1. A semiconductor body 1 is placed in an induction coil $\vec{B}$ and is traversed by a current I ($\vec{I}$ and $\vec{B}$ perpendicular).

The Hall voltage is the voltage VH appearing between the sides 2, 3 parallel to the current I circulating in semiconductor 1, when the latter is exposed to perpendicular magnetic induction $\vec{B}$. It is due to the deviation by magnetic induction $\vec{B}$ of the electrons moving in semiconductor 1.

The law linking the different quantities is written:

$$VHx = \frac{Iy \cdot Bz}{n.e.t} \quad (1)$$

in which n is the number of conduction electrons per cubic centimeter, t the thickness of the material and e the electron charge. Equation (1) consequently makes it possible to determine the induction Bz, to within an proportionality constant, if Iy and VHx are known.

In order to have a good sensitivity, a semiconductor material is sought with a minimum carrier density n and a thickness t.

On the basis of (1), it could be imagined that it would be sufficient to increase the polarizing current I to increase VH. However, there is unfortunately a practical limit to the increase of I, due to the resulting temperature rise. To extend the said limit, it is necessary to have a semiconductor with a good electrical conductivity.

As this electrical conductivity is expressed by the equation (2):

$$\sigma = e.n.\mu_n \quad (2)$$

in which $\mu_n$ is the mobility of the negative charges it is apparent that in order to have a good conductivity, it is necessary to use a semiconductor with a maximum mobility of the carriers $\mu_n$.

The semiconductors which best satisfy this criterion are InSb with $\mu n = 78,000$ cm$^2$/Vs and InAs with 33,000 cm$^2$/Vs. For comparison, GaAs $\mu n = 8500$, InP $\mu n = 4600$, Ge $\mu n$ 3900 and Si $\mu n$ 1900.

Therefore, InSb is preferably used which, apart from the greater mobility, has the lowest melting point of 525° C.

Another criteria which has become important of late through the development of new technology for the production of transducers is the aptitude therefore to permit mass and therefore economic production of large numbers of small transducers.

Thus, in summarizing, the main qualities required of such a technology are based on its possibilities:

(1) of using a material with a high mobility of the carriers $\mu n$;
(2) permitting the minimum semiconductor thickness t;
(3) permitting the formation of very small transducers (few microns);
(4) leading to the simultaneous production of a very large number of transducers.

The oldest and presently most widely known technology for producing Hall effect detectors consists of using ingots of monocrystals of InSb or InAs, cutting them into slices, bonding these slices to a substrate, making the slices thinner by polishing and then etching the material to obtain the desired shape of the transducers.

With this process, condition 1 is very well satisfied because it is possible to use an almost perfect monocrystal. Condition 4 can be partly satisfied. However, it is very difficult to satisfy conditions 2 and 3, because only when great precautions are taken is it possible to achieve thicknesses of approximately 10 $\mu$m, which still represents a high value. Apart from a sensitivity loss, this considerable thickness limits the fineness of the etching configuration and consequently the dimensions of the transducer which can be obtained (several dozen microns), whereas many applications require transducers of approximately 1 micron.

Confronted with this difficulty, numerous laboratories considered using thin film technology for depositing the semiconductor directly on the substrate. In this case, it is easy to satisfy conditions 2, 3, and 4, because it is easier to deposit a film with a thickness of a fraction of a micron than thick films.

However, in this case condition 1 is very difficult to satisfy. Thus, the material obtained by vacuum deposition is polycrystalline, i.e. it is formed by a large number of very small crystals, which significantly limit the mobility of the electrons, the mobility generally being below 1000 cm$^2$/Vs in the case of InSb. Under exceptional circumstances it can reach 10,000 cm$^2$/Vs using deposition conditions which are very difficult to control, while only having a poor reproducibility.

In order to improve this situation, numerous laboratories have envisaged crystallizing the semiconductor directly on to the substrate while remelting the metal after deposition, so as to obtain a larger grain size during solidification. The most interesting result published in this field is probably that of A. R. Clawson, "Thin solid film", no. 12, p. 291, 1972.

This author worked out a recrystallization method, which can be called the "hot wire method". It was in fact possible to obtain a mobility close to that of the monocrystal. This method, diagrammatically illustrated in FIG. 2 consists of placing a taut resistive wire 5 in the vicinity of the thin film 1 deposited on substrate 4, melting film 1 over a narrow width 6 ($\sim$1 mm) by passing an electric current through wire 5 and displacing the molten area 6 by moving wire 5 in front of substrate 1. The molten area 6 consequently separates the polycrystalline part 7 from the recrystallized part 8 of semiconductor 1.

Following this publication, this method had been taken up by several laboratories virtually without any modification. Good examples of attempted applications appear in the publications of Tetsu Oi et al., Japanese Journal of applied physics, vol. 17, no. 2, February 1978, pp. 407–412 and Nobuo Kotera et al, IEEE trans. on magnetics, vol MAG 15, no. 6, November 1979.

Although very interesting, this method suffers from a certain number of deficiencies, which explains why it has not passed beyond the laboratory stage.

The main difficulties encountered in practice are due to the fact that after recrystallization, there are very serious variations in the thickness of the film. These irregularities can even extend to holes at certain locations, which is readily apparent from the two aforementioned publications.

This disadvantage is particularly prejudicial in the case of real applications because, apart from the fact that it does not make it possible to produce devices with well controlled properties and geometries, it prevents any precise microlithography operations, and consequently the production of small transducers.

Thus, the authors have had to use a difficult process of polishing after recrystallization, which removes virtually all interest in the thin film technology.

Another disadvantage of the heating wire method is that it can lead to very severe thermal stresses in the substrate. In certain cases (e.g. detector on garnet for bubble stores) this is sufficient to break the substrate and prevent any use.

Another less serious, but nevertheless real difficulty of this method is that the thermal conductivity between the wire and the substrate has to be well controlled, which makes it necessary to work under helium and consequently makes the production process more difficult.

SUMMARY OF THE INVENTION

The present invention relates to a process for the production of thin film Hall effect transducers making it possible, while still being a recrystallization method after deposition, to solve in a particularly simple and effective manner all the aforementioned problems of the prior art.

The present invention therefore specifically relates to a process for the production of thin film Hall effect transducers of the type comprising semiconductor elements deposited on vacuuo in thin film form, on a substrate and recrystallized in situ following deposition by a remelting of the semiconductor material, wherein it comprises the following stages:

following vacuum deposition of the thin semiconductor film on the substrate, the active elements of the transducer are cut from said film by any known means, such as chemical etching or ionic bombardment, so as to produce these active elements in the form of narrow strips, particularly having a width less than 20 μm;

the substrate and active elements are then covered with an insulating $SiO_2$ coating;

the said coating is covered with a conductive metal coating with a thickness of approximately 1000 Å and from a material such as NiCr or W, which has a good heat resistance;

said heat-resistant metal coating is etched so as to form local heating resistors above the narrow semiconductor strips;

passing an electric current into said heating resistors so as to obtain by the Joule effect the heating and then the melting and recrystallization of the semiconductor strips;

by successive chemical etching operations, the local heating resistors above the semiconductor strips are removed and then the $SiO_2$ coating is removed from the substrate except at the semiconductor strips; and a conductive coating is formed on the substrate for the contact points for supplying the transducer with polarizing current and for sampling the Hall voltage.

As in the prior art processes, the vacuum deposition of the semiconductor coating on a substrate can be carried out by vacuum evaporation. Nevertheless, it is advantageously possible to use cathodic sputtering so as to obtain a homogeneous material and which is consequently appropriate for the subsequent precise microlithography operations.

One of the essential features of the process is that the form chosen for the active parts of the transducers produced by chemical etching or ionic bombardment, consists of an arrangement in parallel or in series of elongated narrow strips, which typically have a width less than 20 μm. Two basic advantages result from havng a transducer with active zones formed from narrow elements. It is firstly possible to have a heating current in the local heating resistors having a relatively low value. During the recrystallization operations of the narrow semiconductor strips, it also makes it possible to prevent a lack of thickness uniformity because, over such a short width, the liquid semiconductor has no possibility of forming waves, which would then set during solidification.

Another important advantage of the process according to the invention is that the conductive metal coating covering the zones to be recrystallized is well defined and makes it possible to heat the latter zone only in a very precise manner.

Finally, the different production stages of the process according to the invention readily permit the simultaneous production of a large number of microscopic Hall effect transducers from the same semiconductor layer deposited on a substrate. This constitutes a by no means negligible advantage of the present process, compared with the previously used mobile heating wire method.

According to an improved variant of the preceding production process, the etching of the heating resistors takes place in a slightly off-centered manner with respect to the longitudinal axis of that part of the narrow semiconductor strip which is used in the transducer, i.e., the active part. In other words, the procedure is such that during the solidification of a melted zone to obtain its recrystallization, the two solidification fronts which are symmetrical with respect to the resistor and which approach one another symmetrically during cooling, meet one another along a line which is off-centered by a few micrometers relative to the center of the future active part or strip of the Hall effect transducer. Thus, there is an entrainment by a zone melting effect of the impurities which may be contained in the semiconductor towards one of the lateral edges of the active strip, which eliminates the prejudicial effect of said impurities by permitting a significant improvement of the ratio 1/ne, in which n is the number of conductor electrons per $cm^3$ of the semiconductor and e the elementary charge of each electron. It should be noted that it is not necessary to have a good purity over the entire surface of each strip and a good sensitivity is obtained if the strip length over which the purification is obtained in this way is roughly three times the width of each strip.

BRIEF DESCRIPTION OF THE DRAWINGS

The invention is described in greater detail hereinafter relative to several non-limitative embodiments of the process for producing Hall effect transducers and with reference to the attached FIGS. 1 to 10, wherein.

FIGS. 5 and 6 show two special forms of the cutting of transducers produced according to the process of the invention.

FIGS. 7, 8 and 9 show (9a plan view, 9b sectional view along AA of FIG. 9a) the final stages of the production process according to the invention.

DETAILED DESCRIPTION OF THE PREFERRED EMBODIMENTS

Figure 1:
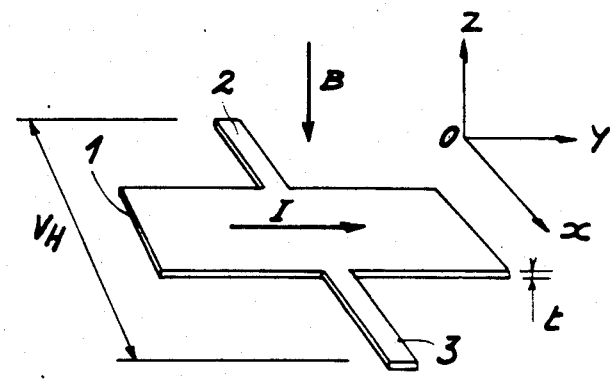
FIG. 1 illustrates a Hall effect device.
Figure 2:
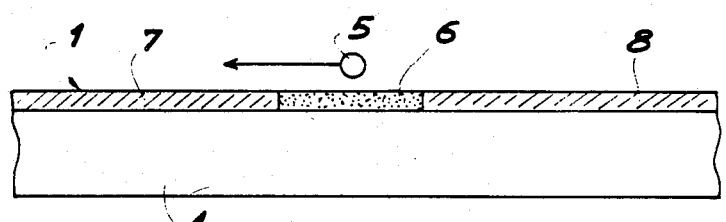
FIG. 2 shows a prior art recyrstallization process.
Figure 3:
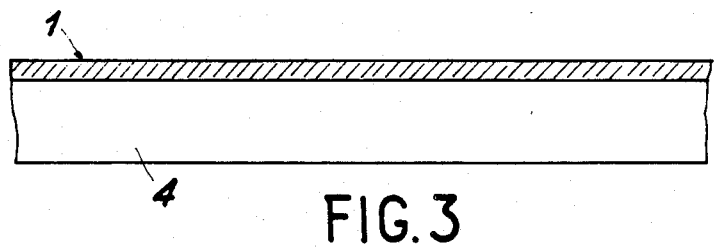
FIGS. 3 and 4 illustrate the two first stages of the production of Hall effect transducers according to the invention.

FIG. 3 shows the first stage of the production process according to the invention, which comprises the deposition on the substrate 4, e.g. of glass or a ceramic material, of an indium antimonide InSb semiconductor coating 1. This deposition can take place by any known means, such as vacuum evaporation or cathodic sputtering, which give a much more homogeneous material and which consequently facilitates subsequent precise microlithography operations.

Figure 4:
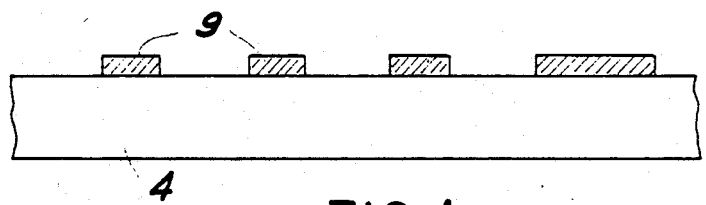

FIG. 4 shows the following stage which is the delimitation by cutting into a certain number of strips such as 9 of the semiconductor coating 1, in order to obtain the active elements in the form of narrow strips, preferably having a width less than 20 μm. This cutting is also obtained by any known means, such as chemical etching with the aid of a mask, or ionic bombardment which makes it possible to remove the semiconductor material with a very high precision at the desired points.

According to the invention, it is preferable to design the transducer in such a way that the active parts used in the generation of the Hall voltage are constituted by a certain number of narrow strips or elements in parallel or in series as shown in FIGS. 5, and 6, which give two possible embodiments.

In FIG. 5, the transducer has four contact zones 10, 11, 12, 13, which have not undergone recrystallization and two active strips 14, 15 at right angles, which undergo recrystallization in order to have a high mobility of the negative charges. Electrodes 10 and 13 are used for the circulation of the polarizing current I in conductive strip 14 and electrodes 11 and 12 are used for the sampling of the Hall voltage Vh.

In a more complicated version of the transducer according to the invention shown in FIG. 6, the active zone traversed by the polarizing current I is cut into a series of narrow strips 14a, 14b, 14c, etc. which are arranged in parallel and electrodes 10, 11, 12 and 13 of FIG. 5 are obtained. Through having a plurality of parallel strips 14a, b, c, d, etc., makes it possible to pass a higher polarizing current into the transducer and consequently to increase the Hall voltage Vh collected at the terminals.

The following stage (FIG. 7) consists of the deposition of an insulating silica $SiO_2$ coating on the structure obtained in FIG. 4. This coating 16 has a thickness of e.g. 1 μm.

The next stage of the process according to the invention consists of covering the silica coating 16 with a conductive, resistive metallic coating 17 with a thickness of approximately 1000 Å, coating 17 is usually constituted either by a nickel-chromium alloy NiCr, or of tungsten W.

Following the deposition of this metallic coating, it is etched so as to form a certain number of heating resistors 17a, 17b, 17c, 17d, visible in FIG. 8, whereof each is located to the right of the semiconductor material strips 9 to be recrystallized. These different heating resistors are cut with the aid of a mask, which can in particular be the same as that used for etching the semiconductor strips 9.

Once the structure of FIG. 8 has been obtained, the indium antimonide InSb is melted by passing a current through the heating resistors 17, whereby current injection can take place by means of pins.

It is at this stage that it is possible to reap the advantages of having the active parts of the transducer in the form of narrow strips. Thus, this structure makes it possible to use a relatively low heating current, thereby avoiding the lack of thickness uniformity of the indium antimonide coating, because, over such a short width, there is no possibility for the liquid phase to form waves which could then be set during solidification.

In a subsequent stage of the process according to the invention, the heating resistors 17 are removed, followed by the $SiO_2$ layer in the non-recrystalline zone. The heating resistors 17 are removed with the aid of a solution containing 25% $H_2SO_4$ at 60° C. in a well known commercial "chromium-etch" solution. Silica $SiO_2$ is chemically etched, e.g. by using hydrofluoric acid.

Figure 9A:
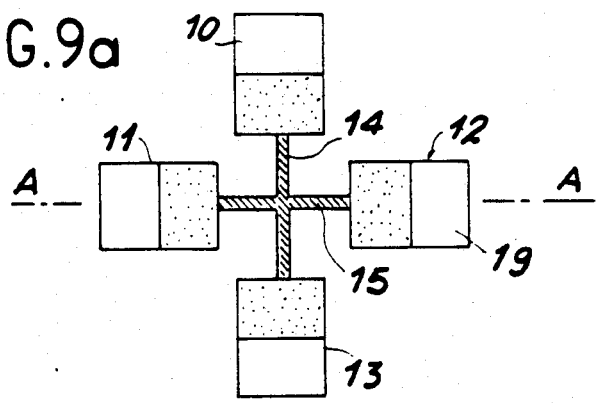
Figure 9B:
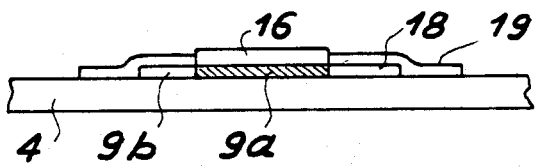

This is following by the final operation, consisting of etching a conductive coating (e.g. of an alloy of chromium and gold CrAu or copper Cu) in silica holes in order to obtain the contacts necessary for the electrical operation of the transducer. At the end of the operation a transducer is obtained like that visible in FIGS. 9a (plan view) and 9b (sectional view), on which are shown the recrystallized indium antimonide conductive strips 14, 15 covered with silica $SiO_3$ and the four contact electrodes 10, 11, 12, 13 placed on the zones where the semiconductor has not been recrystallized. The copper or chromium-gold alloy conductive coating is shown at 18. The InSb semiconductor coating has portions 9a, which have been recrystallized during the preceding melting operations with the aid of local heating resistors 17 and also non-recrystallized portions 9b. The conductive coating 18 permits the connection of connections 19 connecting the transducer to the outside.

In the production process according to the invention, in order to increase the mobility μn of the negative charge carriers in the semiconductor, it is merely necessary to carry out a recrystallization which leads to an increase in the size of the particles. This makes it possible to obtain a ratio 1/ne close to 100 $cm^3$/coulomb, in the case of using InSb as the semiconductor, which is quite acceptable.

Figure 10:
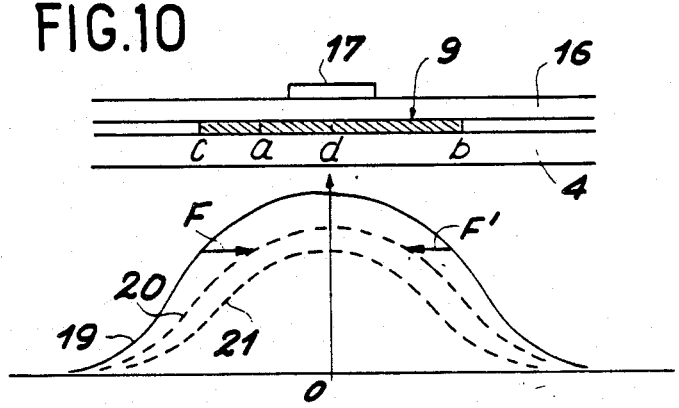
FIG. 10 illustrates the variant of the Hall effect transducer production processes in which there is a purification by zone melting of the recrystallized part of the semiconductor, the lower part of FIG. 10 showing the temperature distribution about the axis of the heating resistor.

However, if it is wished to further improve this performance, by purifying the semiconductor by reducing the number of impurities contained therein which increases the value of the parameter n, this can be brought about by using a variant of the process described in FIG. 10. In this variant, there is a slight displacement of heating resistors 17 a few micrometers with respct to the axis of the active part a,b of the conductive semiconductor strips 9, so that during the solidification of the melted zone 9 the advances of the solidification fronts c, b bring about the meeting thereof at a point d where the impurities displaced by zone melting are concentrated. Point d is offset with respect to the center of active strip a, b effectively used for the Hall effect. The impurities collected around d have no influence on the operation of the transducer, because they are located at the margin of the active center of the corresponding semiconductor strip. To provide a better understanding of the phenomenon, this is shown in a highly exaggerated form in FIG. 10, which shows the elements of the previous drawings with the same reference numerals. These limits b, c represent the molten zone of the semiconductor centered on resistor 17 and a, b the active part of the semiconductor strips subsequently used in the transducer.

In the lower part of the drawing are shown cooling curves 19, 20, 21 showing the temperatures in molten zone 9, as a function of the distance from the axis of resistor 17. Curve 19 shows the maximum temperature obtained at the time of melting, and curve 21 corresponds to the case where said maximum temperature is the melting temperature, i.e. at the time when solidification fronts c and b meet. Between them, curve 20 illustrates the case of an intermediate temperature in the center of the molten zone and arrows F and F' indicate the position of the solidification fronts for this cooling temperature and at this time.

The process according to the invention has the important advantage of requiring no mechanical operation and of being performable in the open air with conventional microelectronics equipment. It permits the production of Hall effect transducers having a good efficiency as a result of a high mobility of the negative charges, where this is useful, and having minimum dimensions and thicknesses, with the advantages of mass production on any random and even fragile substrate. Moreover, it only requires a very low total energy supply during the recrystallization stage.

What is claimed is:

1. A process for the production of thin film Hall effect transducers of the type comprising semiconductor elements deposited in vacuuo in thin film form, on a substrate and recrystallized in situ following deposition by a remelting of the semiconductor material, wherein it comprises the following stages:

following vacuum deposition of the thin semiconductor film on the substrate, the active elements of the transducer are cut from said film so as to produce these active elements in the form of narrow strips having a width less than 20 $\mu$m;

the substrate and active elements are then covered with an insulating $SiO_2$ coating;

the said coating is covered with a conductive heat-resistant metal coating with a thickness of approximately 1000 Å;

said heat-resistant metal coating is etched so as to form local heating resistors above the narrow semiconductor strips;

passing an electric current into said heating resistors so as to obtain by the Joule effect, the heating and then the melting and recrystallization of the semiconductor strips;

by successive chemical etching operations, the local heating resistors above the semiconductor strips are removed and then the $SiO_2$ coating is removed from the substrate except at the semiconductor strips;

a conductive coating is formed on the substrate for the contact points for supplying the transducer with polarizing current and for sampling the Hall voltage.

2. A process for the production of Hall effect transducers according to claim 1, wherein each of said semiconductor strips has an active part with a longitudinal axis; and the heating resistor for each said strip is produced in a slightly offset manner with respect to said axis.

3. A process according to either claim 1 or 2, wherein the semiconductor is indium antimonide and the restrictive metallic coating is selected from tungsten and nickel chromium alloy.

* * * * *